United States Patent
Nishikubo et al.

(10) Patent No.: US 9,996,268 B2
(45) Date of Patent: Jun. 12, 2018

(54) MEMORY SYSTEM AND CONTROL METHOD OF THE SAME

(71) Applicant: TOSHIBA MEMORY CORPORATION, Minato-ku (JP)

(72) Inventors: Ryuji Nishikubo, Kawasaki (JP); Hiroki Matsudaira, Funabashi (JP); Norio Aoyama, Machida (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 274 days.

(21) Appl. No.: 15/067,826

(22) Filed: Mar. 11, 2016

(65) Prior Publication Data
US 2017/0177235 A1  Jun. 22, 2017

Related U.S. Application Data

(60) Provisional application No. 62/269,324, filed on Dec. 18, 2015.

(51) Int. Cl.
*G06F 12/00* (2006.01)
*G06F 3/06* (2006.01)
*G06F 12/02* (2006.01)

(52) U.S. Cl.
CPC .......... *G06F 3/0605* (2013.01); *G06F 3/0656* (2013.01); *G06F 3/0659* (2013.01); *G06F 3/0679* (2013.01); *G06F 12/0246* (2013.01); *G06F 2212/214* (2013.01); *G06F 2212/7203* (2013.01); *G06F 2212/7205* (2013.01)

(58) Field of Classification Search
None
See application file for complete search history.

(56) References Cited

U.S. PATENT DOCUMENTS

2001/0029564 A1  10/2001  Estakhri et al.
2007/0028035 A1   2/2007  Nishihara

FOREIGN PATENT DOCUMENTS

JP   2000-298621   10/2000
JP   2006-330969   12/2006

*Primary Examiner* — Daniel D Tsui
(74) *Attorney, Agent, or Firm* — Oblon, McClelland, Maier & Neustadt, L.L.P.

(57) ABSTRACT

According to one embodiment, a memory system writes data to a first block, and executes a garbage collection when the number of free blocks is not greater than a first threshold value. The memory system calculates a first number which is a ratio of the number of copy destination blocks needed for the garbage collection to the number of blocks to which data designated by a write command is written. The memory system determines whether the first number is greater than a second threshold value when a first command is received from the host, and performs fill-up processing for the first block when the first number is not greater than the second threshold value.

20 Claims, 15 Drawing Sheets

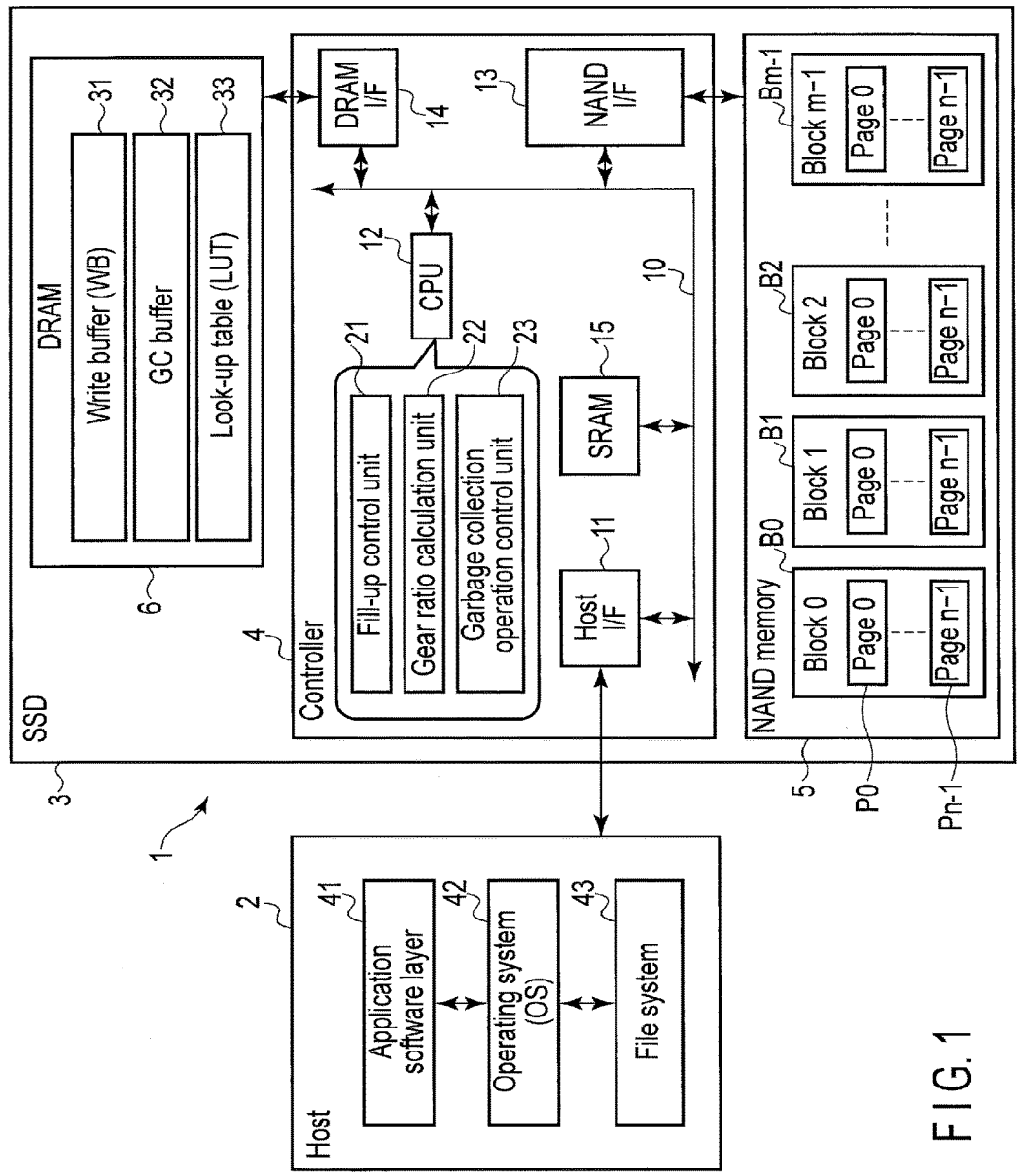
F I G. 1

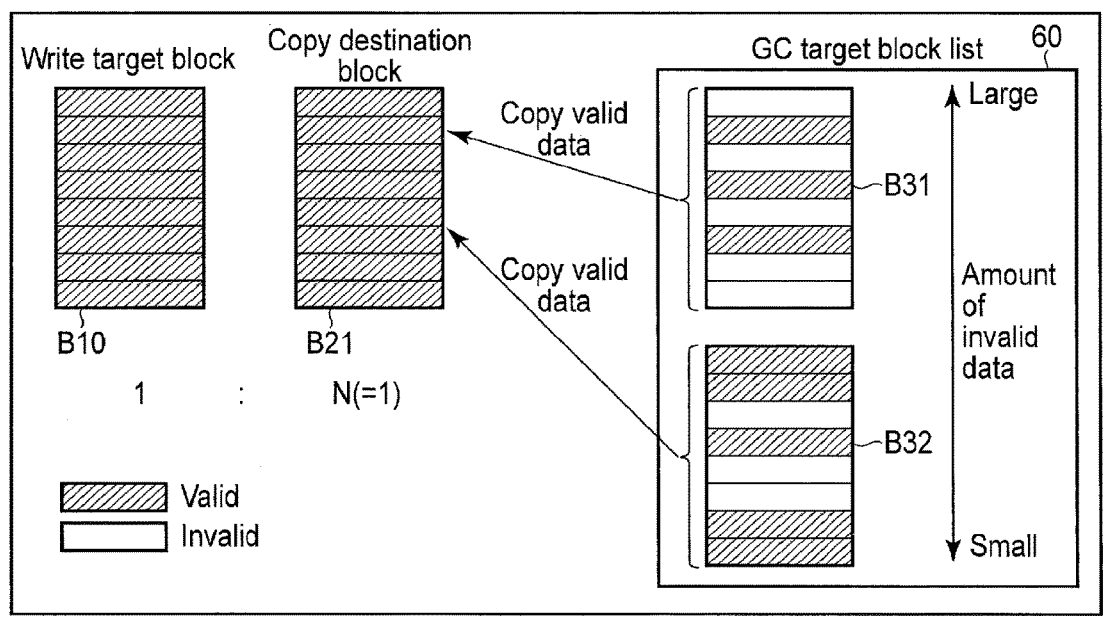
F I G. 4

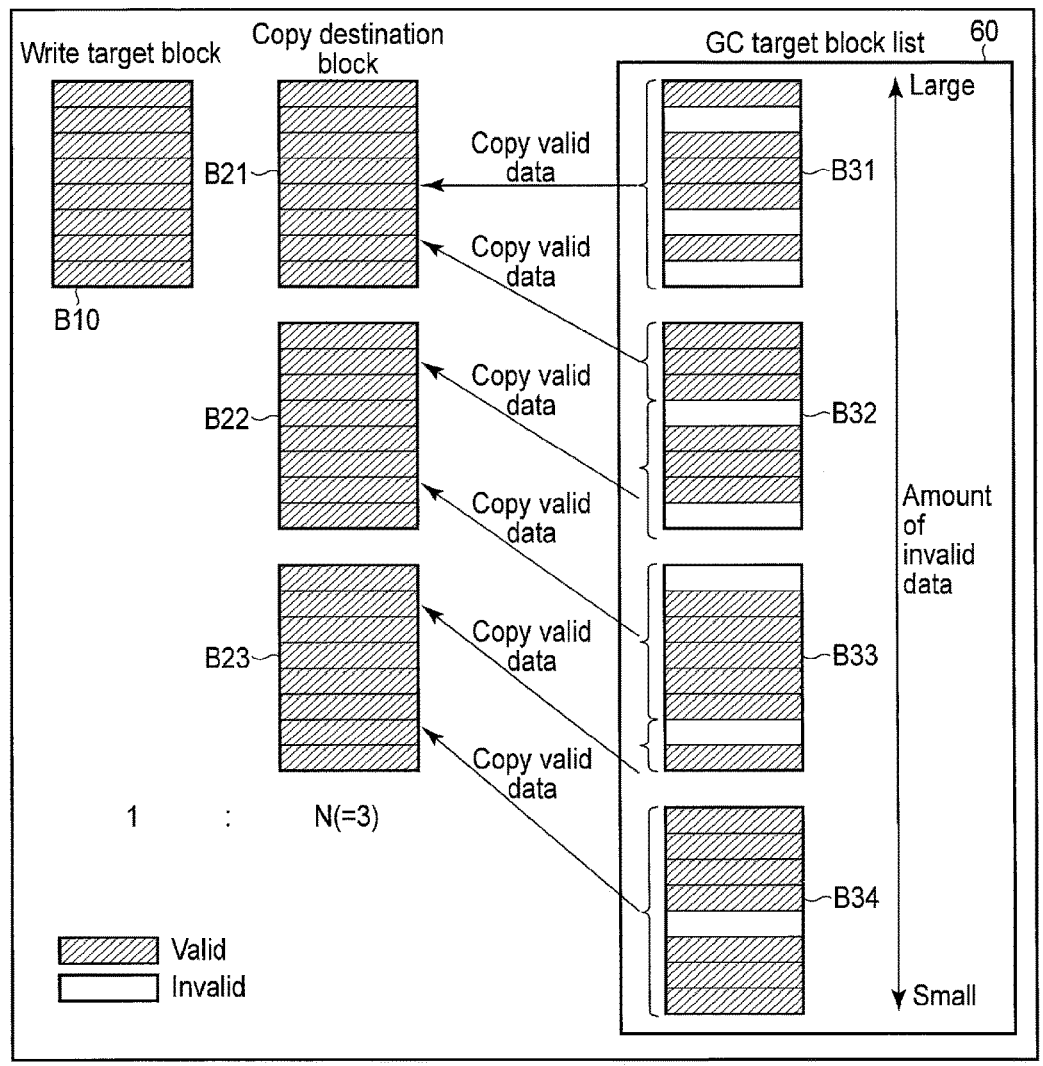
F I G. 5

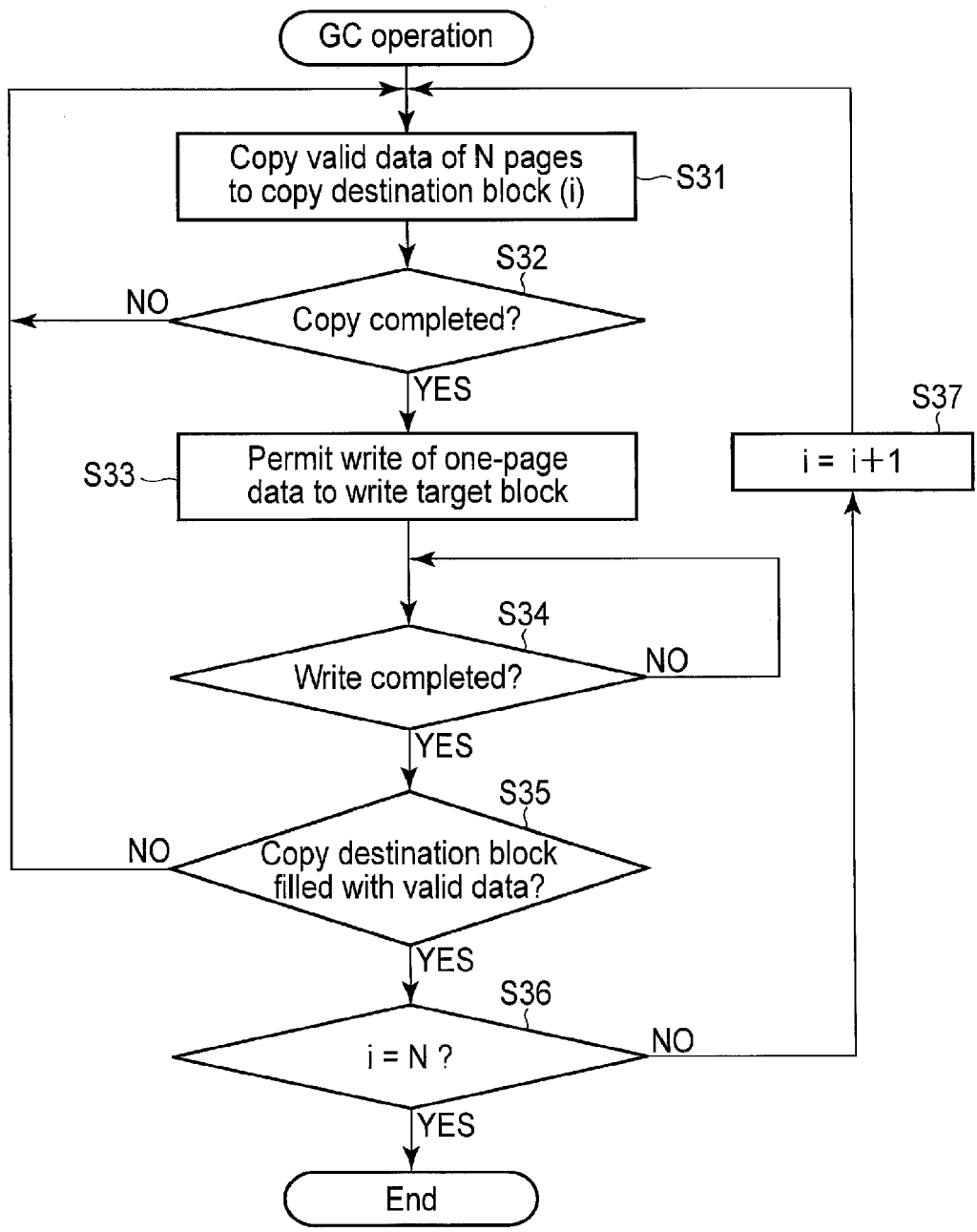
F I G. 9

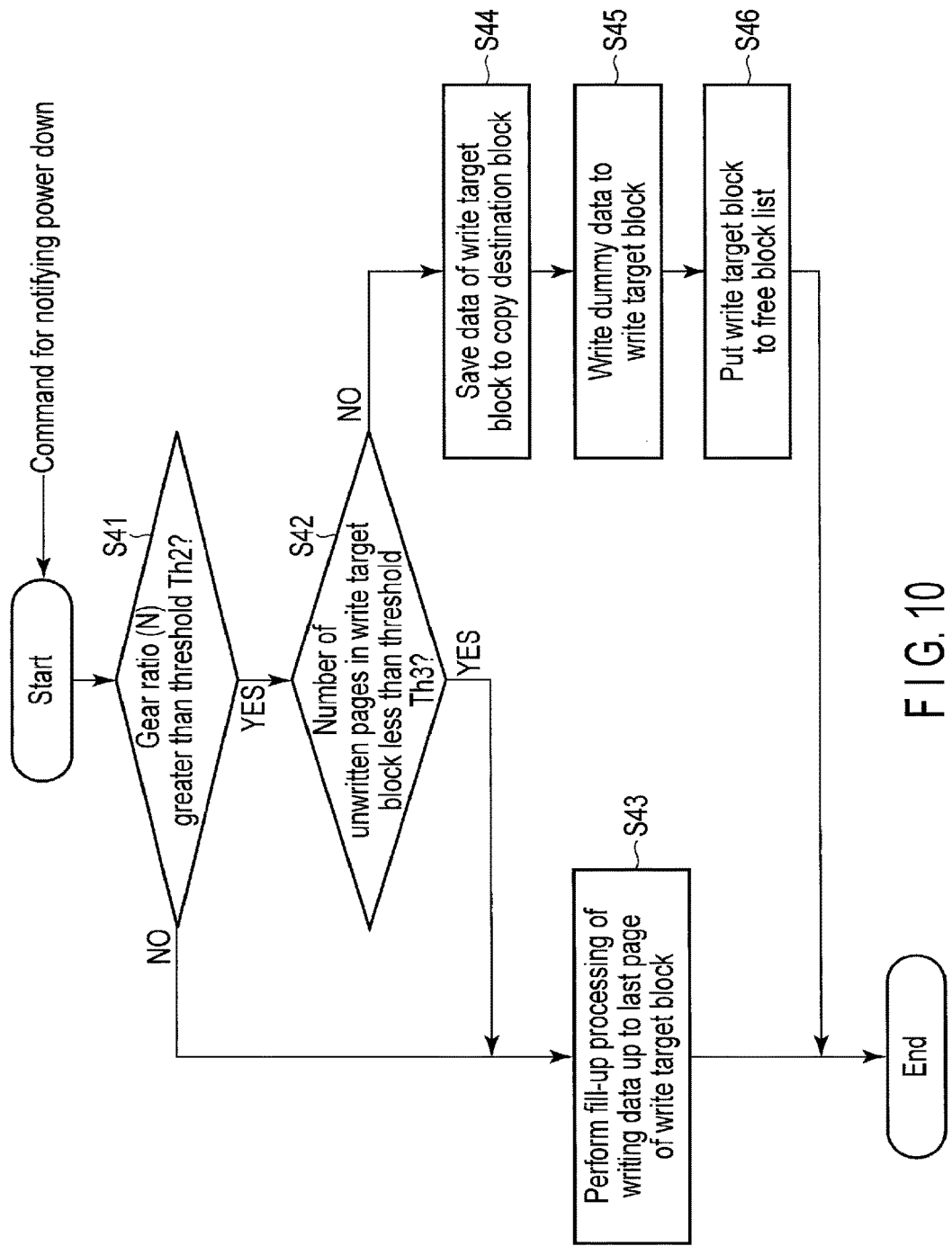
F I G. 10

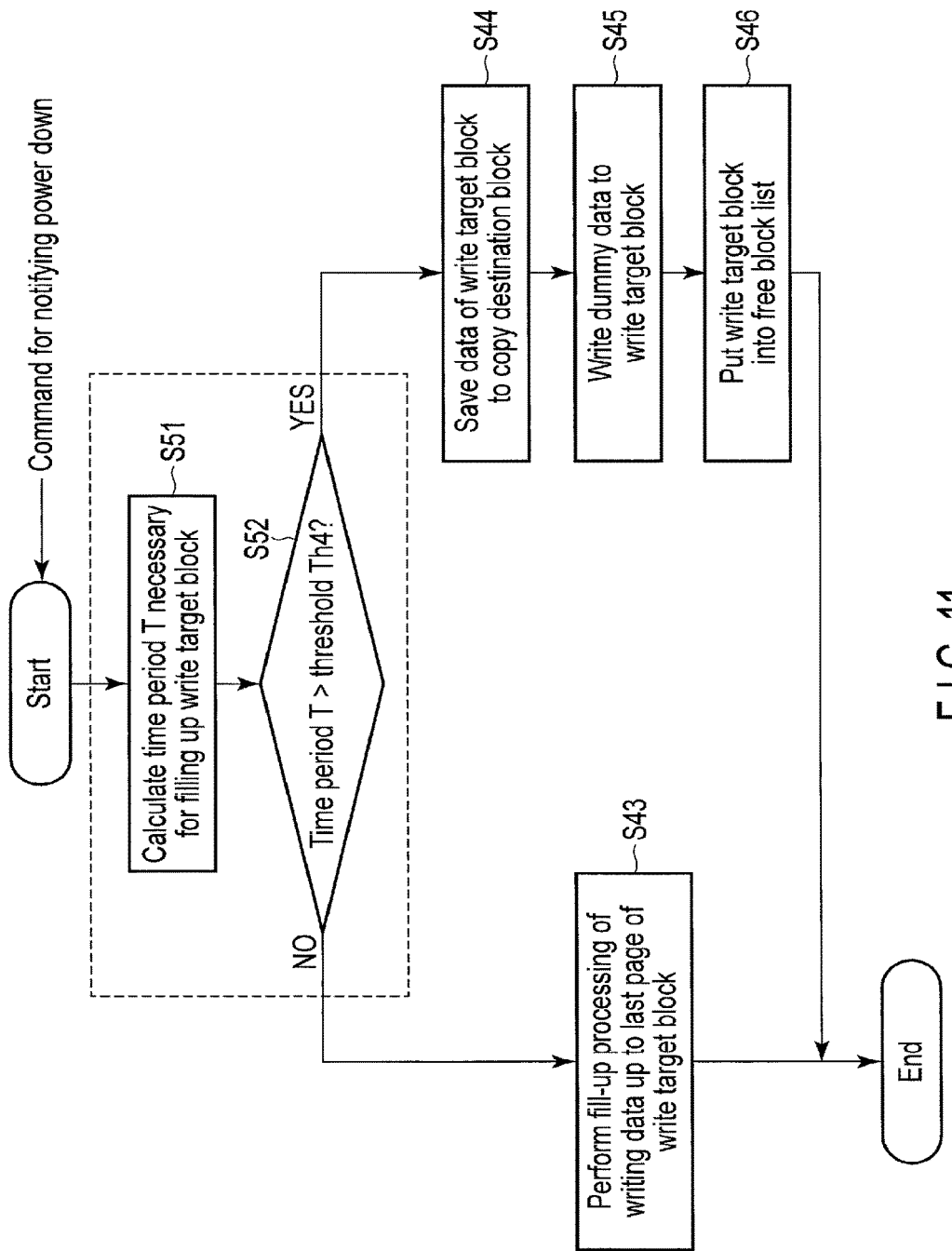
F I G. 11

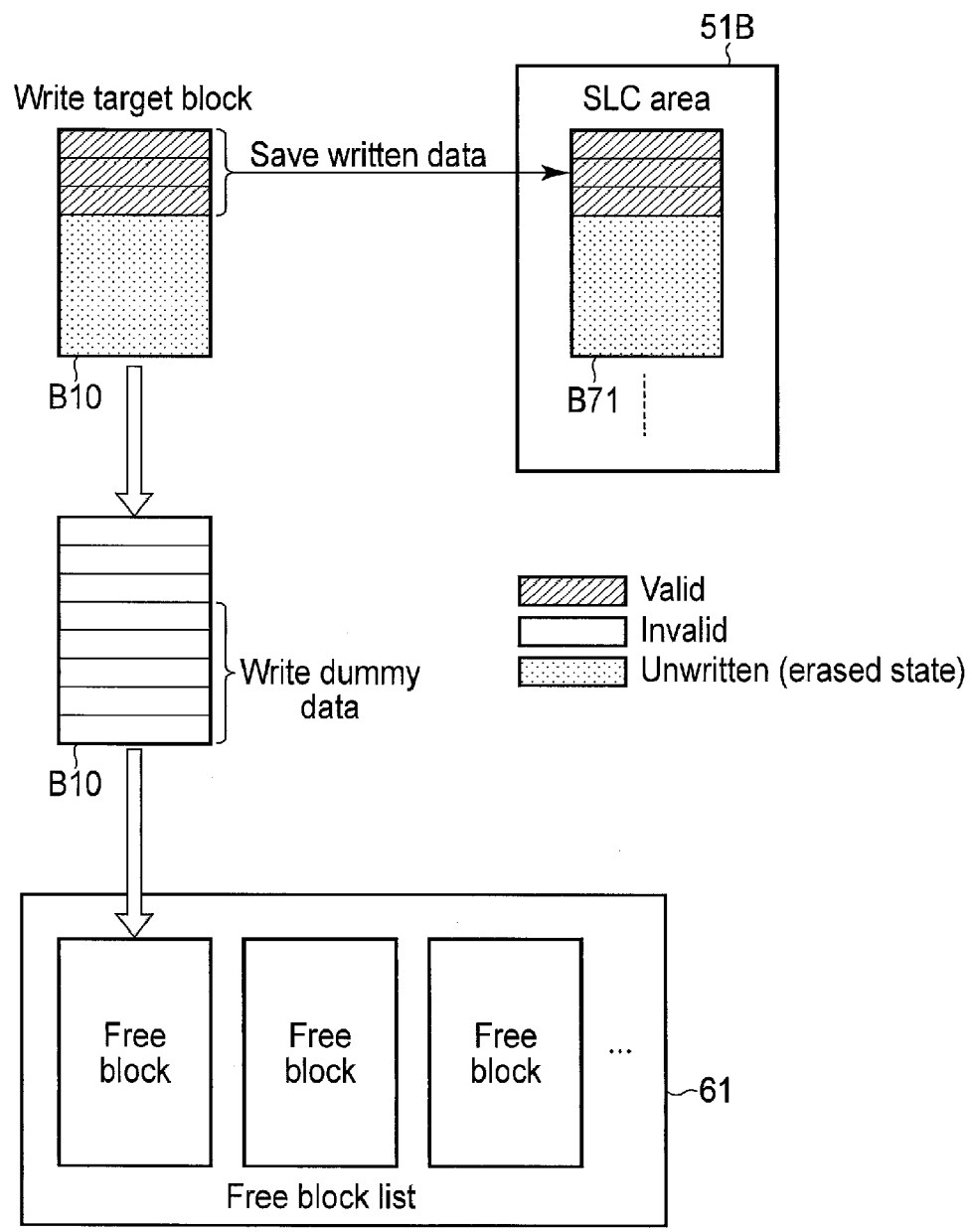
F I G. 13

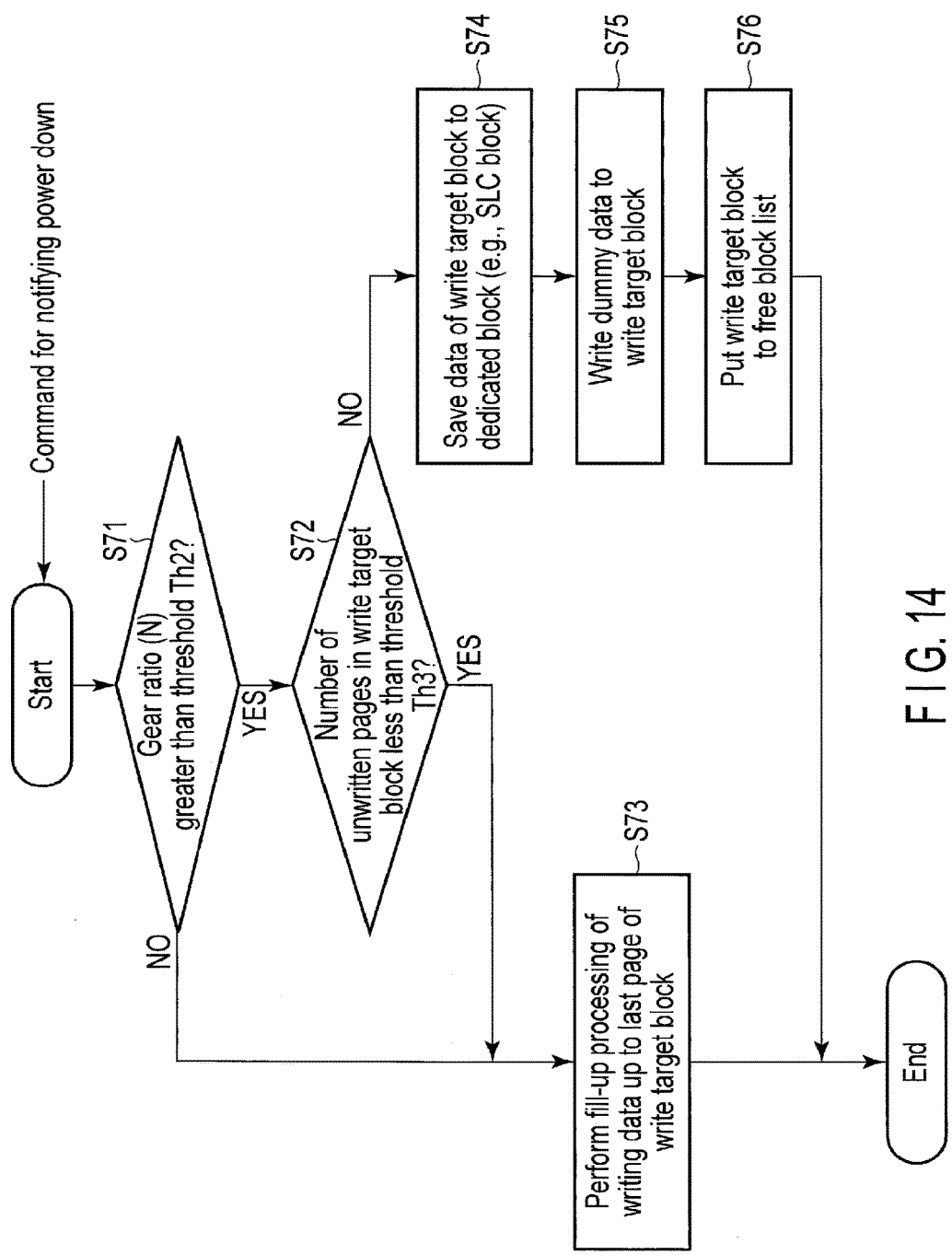
F I G. 14

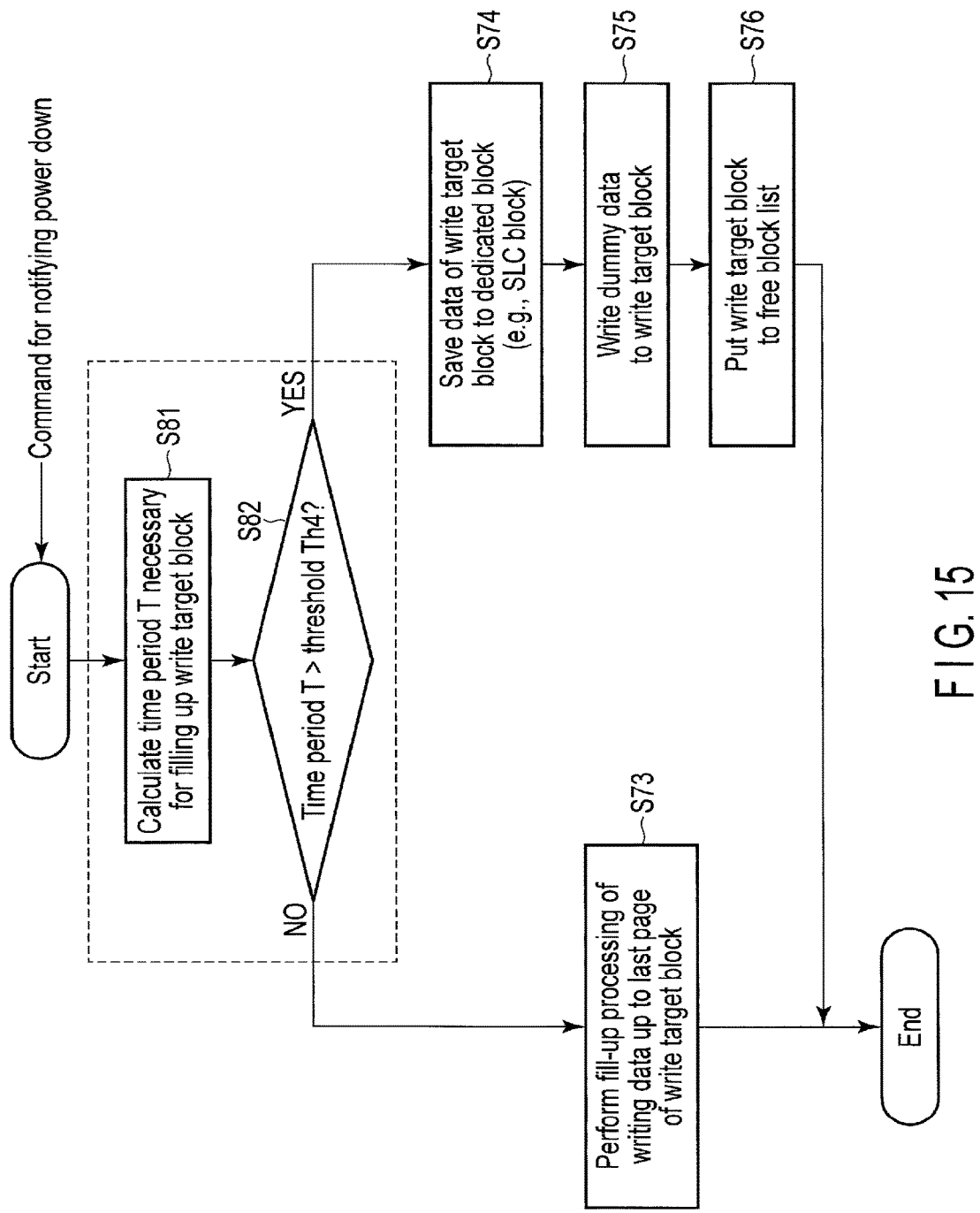
F I G. 15

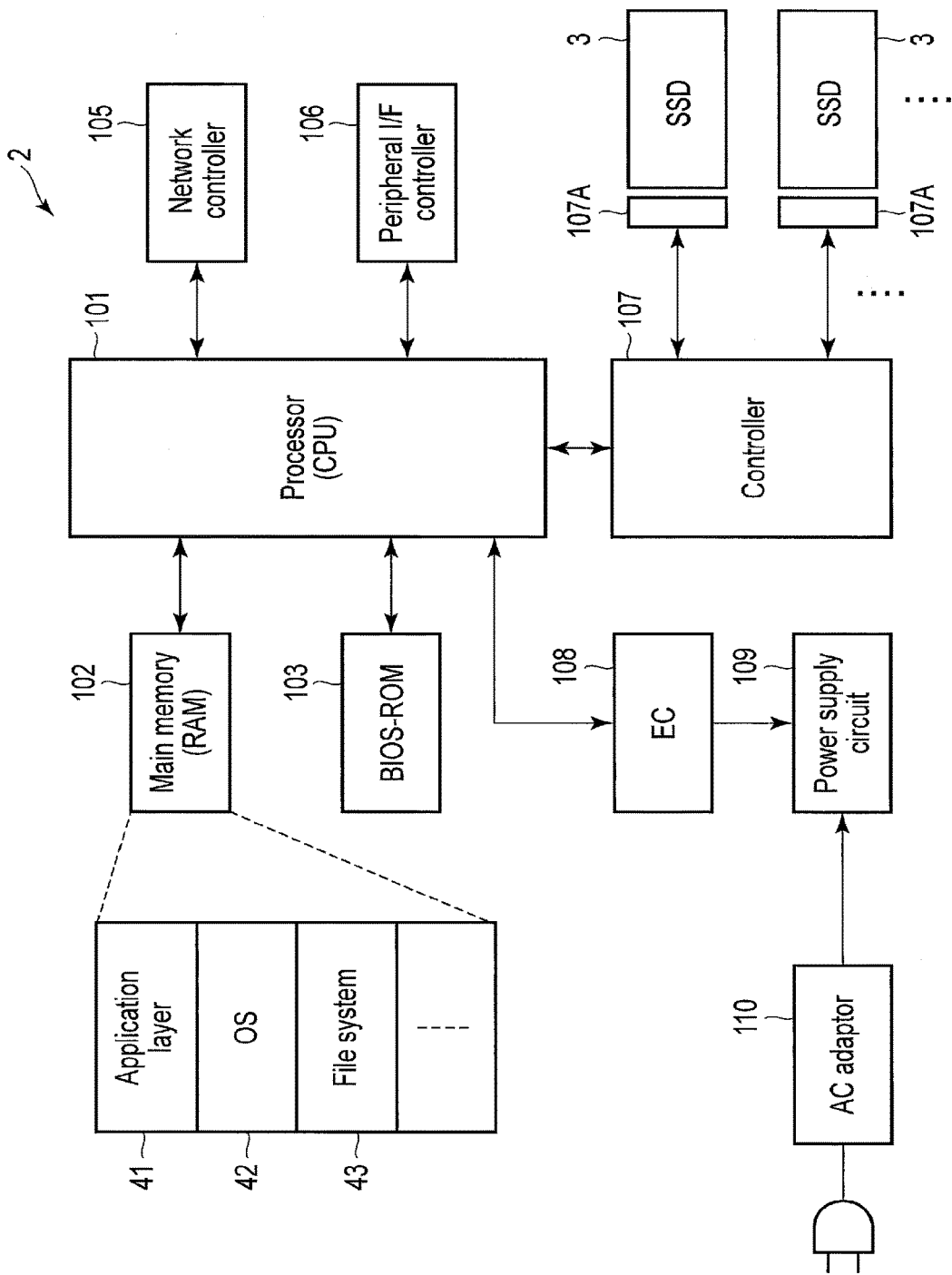
F I G. 16

MEMORY SYSTEM AND CONTROL METHOD OF THE SAME

CROSS-REFERENCE TO RELATED APPLICATIONS

This application claims the benefit of U.S. Provisional Application No. 62/269,324, filed Dec. 18, 2015, the entire contents of which are incorporated herein by reference.

FIELD

Embodiments described herein relate generally to a memory system.

BACKGROUND

In recent years, a storage device with a nonvolatile memory is widely used as main storage for various data processing apparatuses.

In such recent storage devices, there is a demand for high performance that enables processing requested by a host to be executed at high speed.

BRIEF DESCRIPTION OF THE DRAWINGS

FIG. 1 is a block diagram showing a configuration example of a memory system according to an embodiment.

FIG. 4 is a view for illustrating processing for filling up the write destination block with data, and a garbage collection operation with a gear ratio N of 1, which are performed by the memory system of the embodiment.

FIG. 5 is a view for illustrating processing for filling up the write destination block with data, and a garbage collection operation with a gear ratio N of 3, which are performed by the memory system of the embodiment.

FIG. 9 is a flowchart for illustrating the procedure of the garbage collection operation performed by the memory system of the embodiment.

FIG. 10 is a flowchart for illustrating the procedure of processing performed by the memory system of the embodiment when a command to prepare for power interruption is received.

FIG. 11 is a flowchart for illustrating another procedure of processing performed by the memory system of the embodiment when a command to prepare for power interruption is received.

FIG. 13 is a view for illustrating processing performed by the memory system of the embodiment for saving data in a write destination block to a dedicated block allocated for data saving.

FIG. 14 is a flowchart for illustrating yet another procedure of processing performed by the memory system of the embodiment when a command to prepare for power interruption is received.

FIG. 15 is a flowchart for illustrating a further procedure of processing performed by the memory system of the embodiment when a command to prepare for power interruption is received.

FIG. 16 is a block diagram showing a configuration example of the host to which the memory system of the embodiment is applied.

DETAILED DESCRIPTION

Figure 2:
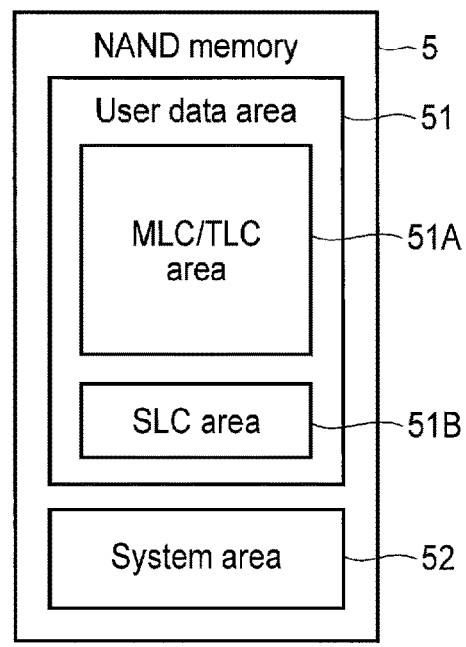
FIG. 2 is a view for illustrating a data area and a system area included in a nonvolatile memory for the memory system of the embodiment.

Various embodiments will be described hereinafter with reference to the accompanying drawings.

In general, according to one embodiment, a memory system comprises a nonvolatile memory, a volatile memory, and a controller. The nonvolatile memory includes a plurality of blocks. The volatile memory includes a write buffer configured to temporarily store data designated by a write command received from a host. The controller is electrically connected to the nonvolatile memory. The controller writes the data stored in the write buffer to a first block included in the plurality of blocks.

The controller executes a garbage collection when the number of free blocks in the nonvolatile memory is not greater than a first threshold value. The controller calculates a first number based on amounts of invalid data in a plurality of second blocks, the first number being a ratio of the number of copy destination blocks needed for the garbage collection to the number of blocks to which the data designated by the write command is written.

The controller determines whether the first number is greater than a second threshold value, when an empty area exists in the first block and the controller receives a first command from the host, the first command being either a command for instructing preparation of power-off, or a command for requesting flushing the data stored in the write buffer to the nonvolatile memory.

When the first number is not greater than the second threshold value, the controller performs fill-up processing for the first block by writing, to the empty area in the first block, at least one of unwritten data in the write buffer and data written to the nonvolatile memory.

When the first number is greater than the second threshold value, the controller saves the data written to the first block to a third block and writes dummy data to the empty area of the first block.

Referring first to FIG. 1, a description will be given of the configuration of an information processing system 1 including a memory system according to a first embodiment.

The memory system is a semiconductor storage device configured to write data to a nonvolatile memory and read data therefrom. The memory system is realized as, for example, a solid-state drive (SSD) 3 including a NAND flash memory.

The information processing system 1 comprises a host (host device) 2 and the SSD 3. The host 2 may be an information processing apparatus, such as a server or a personal computer.

The SSD 3 may be used as a main storage (also called external storage) for an information processing apparatus that functions as the host 2. The SSD 3 may be built in the information processing apparatus, or may be connected to the information processing apparatus through a cable or a network.

The host 2 and the SSD 3 are connected by a communication interface. Serial Advanced Technology Attachment (SATA), Serial Attached SCSI (SAS), NVM Express (NVMe), etc., can be used as the communication interface.

The SSD 3 comprises a controller 4, a nonvolatile memory (NAND memory) 5 and a dynamic random access memory (DRAM) 6. The DRAM 6 is an example of a volatile memory. However, the volatile memory included in the SSD 3 is not limited to the DRAM 6, but may be, for example, an SRAM or another type of RAM. The NAND memory 5 is not limited, but may include a plurality of NAND flash memory chips each having a memory cell array.

Each memory cell array has a plurality of memory cells arranged in a matrix. The memory cell array includes a plurality of blocks (physical blocks) each serving as an erase unit. Each block comprises a plurality of pages (physical pages).

That is, the NAND memory 5 comprises a large number of blocks (physical blocks) B0 to Bm−1, and each of blocks B0 to Bm−1 comprises pages P0 to Pn−1. In the NAND memory 5, a data read and a data write are performed in page unit. Data erase is performed in block unit.

The controller 4 is electrically connected to the NAND memory 5, which is a nonvolatile memory, through a NAND interface 13, such as Toggle or ONFI. The controller 4 may function as a flash translation layer (FTL) configured to perform data management and block management of the NAND memory 5.

The data management includes, for example, (1) management of mapping information indicating the correspondence relationship between logical block addresses (LBA) and physical addresses, and (2) processing of hiding read/write operations performed page by page, and an erase operation performed block by block. Mapping between the LBAs and the physical addresses is managed using a look-up table (LUT) 33. The look-up table (LUT) 33 is also called a logical-to-physical address translation table.

A physical address corresponding to a certain LBA indicates a storage position in the NAND memory 5, in which the data of this LBA is written. Each physical address includes a physical page address and a physical block address. Physical page addresses are allocated to respective pages, and physical block addresses are allocated to respective physical blocks.

Writing of data to a page is enabled only once per erase cycle.

Because of this, the controller 4 maps writes to the same LBA to different pages in the NAND memory 5. That is, the controller 4 writes data to another page. After that, the controller 4 updates the look-up table (LUT) 33 to associate the LBA with another page and invalidate the original page (namely, old data associated with the LBA).

The block management includes management of bad blocks, a wear leveling operation, a garbage collection operation, etc.

The garbage collection operation is an operation for creating free blocks in the NAND memory 5. In the garbage collection operation, in order to increase the number of free blocks in the NAND memory 5, all valid data in some blocks that each contain both valid and invalid data is copied to one or more other blocks (for example, free blocks). After that, in the garbage collection operation, the look-up table (LUT) 33 is updated to thereby map the respective LBAs of the copied valid data to correct physical addresses. The valid data means data associated with an LBA, while the invalid data means data that is not associated with an LBA.

A block which includes only the invalid data as the valid data has been copied to another block is released as a free block. Thus, this block becomes able to be reused after the erase.

Next, the configuration of the controller 4 will be described.

The controller 4 comprises a host interface 11, a CPU 12, a NAND interface 13, a DRAM interface 14, an SRAM 15, etc. The CPU 12, the NAND interface 13, the DRAM interface 14 and SRAM 15 are interconnected via a bus 10.

The host interface 11 receives various commands (a write command, a read command, etc.) from the host 2.

The write command requests the SSD 3 to write data (first data) designated by this write command. The first data will hereinafter be referred to also as write data. The write command includes a starting LBA and a transfer length. The starting LBA is a logical block address of a first logical block to be written. The transfer length indicates the number of logical blocks to be written, namely, the size of write data.

The read command requests the SSD 3 to read data designated by the read command. The read command includes a starting LBA and a transfer length. The starting LBA is a logical block address of a first logical block to be read. The transfer length indicates the number of logical blocks to be read, namely, the size of data to be read.

The CPU 12 is a processor configured to control the host interface 11, the NAND interface 13, the DRAM interface 14 and the SRAM 15. When the SSD 3 is supplied with power, the CPU 12 loads a predetermined control program (firmware), stored in the NAND memory 5 or a ROM (not shown), into the SRAM 15 or the DRAM 6, thereby performing predetermined processing. The CPU 12 may execute, for example, command processing for processing various commands from the host 2, in addition to the above-mentioned FTL processing.

For instance, when the controller 4 receives a write command from the host 2, the CPU 12 of the controller 4 may perform write operation control including processing described below.

First, the CPU 12 stores, in a write buffer (WB) 31, data to be written (write data) received from the host 2. Subsequently, the CPU 12 transmits, to the host 2, a response indicating completion of the write. The CPU 12 writes the write data of the write buffer (WB) 31 to a certain block (called a write target block or a first block) in the NAND memory 5. The write target block is a block currently allocated for writing of data from the host 2. One of free blocks shown in a free-block list is allocated as the write target block. The allocated write target block is erased, whereby all pages in the write target block become an erased state (i.e., all pages become available pages). The page in an erased state will hereinafter be referred to also as an erased page. The data from the host is sequentially written to the write target block, beginning with a first available page therein. For example, first data from the host is written to the first available page, and subsequent data therefrom is written to a subsequent available page.

The operation of the CPU 12 is controlled by the firmware executed by the CPU 12. The firmware causes the CPU 12 to function as a fill-up control unit 21, a gear-ratio calculation unit 22, and a garbage collection operation control unit 23.

The fill-up control unit 21 performs data writing up to the last page of the write target block that is currently partially filled with data. This can prevent some pages of the write target block from being left in an erased state for a long time. Leaving a page being erased for a long time may make it difficult to program data to the page. It is advantageous to perform data writing in block unit, if possible. However, in general, each block has a large capacity (for example, several tens megabytes).

In view of the above, when a command to instruct the SSD 3 to prepare for power-off is received from the host 2 in a state in which the write target block is partially filled with data from the host, the fill-up control unit 21 fills up the write target block with data (valid data). This is because if the SSD 3 is powered off due to, for example, shutdown of the host 2, writing of data to an empty area of an erased state in the write target block may not occur for a long time. In such a case, the reliability of the empty area of an erased state may be reduced.

The state in which the write target block is partially filled with data (write data) from the host means a state in which data from the host is written to only part (one or more pages in all pages) of the write target block, and hence an empty area with no data (one or more pages of an erased state) exists in the write target block. Moreover, fill-up of the write target block with data (valid data) means completely filling the entire empty area of the write target block by writing data up to the last page of the write target block.

In the fill-up processing for filling up a write target block, the fill-up control unit 21 writes, to an empty area in the write target block, at least one of data in the write buffer (WB) 31, which is not yet written to the NAND memory 5, and data (valid data) had already been written to the NAND memory 5, thereby filling up the write target block with data. The empty area is an area including a group of pages of an erased state, i.e., a group of erased pages.

If the write buffer (WB) 31 holds unwritten data that is not yet written to the NAND memory 5, the fill-up control unit 21 firstly writes the unwritten data in the write buffer (WB) 31 to the write target block. If the write buffer (WB) 31 holds unwritten data, but the amount of this data is less than the size of the empty area of the write target block, the fill-up control unit 21 writes the unwritten data to the NAND memory 5, and then writes data (valid data) in the NAND memory 5 to the empty area of the write target block, thereby eliminating the empty area. If the write buffer (WB) 31 does not hold unwritten data that is not yet written to the NAND memory 5, it is sufficient if the fill-up control unit 21 writes only data (valid data) already written to the NAND memory 5 to the empty area of the write target block, thereby completely filling the entire empty area.

As a command to instruct the SSD 3 to prepare power-off, the host 2 may use a standby immediate command or a standby command in the ATA or SATA system, a command included in a start-stop protocol in the SCSI or SAS system, and a command for shutdown notification in the NVMe system. That is, when the host 2 assumes a shutdown state or a sleep (for example, hibernation) state, it transmits, to the SSD 3, a command, such as the standby immediate command, for instructing the SSD 3 to prepare for power-off.

After receiving, from the SSD 3, an acknowledge as a response indicating that preparation for the power-off is completed, the host 2 turns off power for operating the host 2 and the SSD 3, and goes into the shutdown state or the sleep (for example, hibernation) state.

The fill-up processing may be executed not only when a command for instructing the SSD 3 to prepare power-off is received from the host 2, but also when a cache flush command, for example, is received from the host 2. The cache flush command is a command to instruct the SSD 3 to flush (write), to the NAND memory 5, data in the write buffer (WB) 31 that is not yet written to the NAND memory 5.

The gear-ratio calculation unit 22 computes, as a gear ratio, the number (N) of copy destination blocks necessary to increment one free block by a garbage collection operation while one block is being consumed by data from the host 2. That is, the gear ratio indicates the ratio between a data writing amount by a normal operation and a data writing amount by the garbage collection operation. This ratio can be expressed as the ratio between the number of write target blocks and the number (N) of copy destination blocks, namely, the ratio of the number of copy destination blocks necessary for the garbage collection, to the number of blocks to which the data designated by a write command is written.

The calculation of the gear ratio (the number [N] of copy destination blocks) may be executed when the garbage collection (GC) operation is necessary, for example, when the number of free blocks in the NAND memory 5 decreases to a predetermined threshold value or less. The gear ratio (the number (N) of copy destination blocks) is computed based on the amount of invalid data of each of the blocks (second blocks) selected as garbage collection operation targets, i.e., the amount of invalid data in each fragmented block. The second blocks will hereinafter be referred to also as GC target blocks. The fragmented block means a block in which valid data and invalid data are mixed, namely, a block filled with valid and invalid data.

If one copy destination block is required to copy the valid data of two blocks, the number (N) of copy destination blocks is 1. This is because while two new free blocks are created, one free block allocated as a copy destination block is consumed, which means that the number of free blocks can be incremented by one while one block is consumed by data from the host 2.

In contrast, if the amount of valid data in each of blocks (fragmented blocks) selected as garbage collection operation targets is relatively large, the number (N) of copy destination blocks increases. This is because the amount of valid data needed to be copied from the fragmented blocks increases.

The garbage collection operation control unit 23 performs a garbage collection operation for copying the valid data of some blocks (fragmented blocks), selected as garbage collection operation targets, to computed N copy destination blocks. The garbage collection operation is performed when, for example, the number of free blocks in the NAND memory 5 decreases to the above-mentioned predetermined threshold value or less.

In a period in which the number of free blocks in the NAND memory 5 is more than the above-mentioned predetermined threshold value, the current gear ratio (the number [N] of copy destination blocks) may be set to an initial value (for example, zero).

The NAND interface 13 is a NAND controller configured to control the NAND memory 5 under control of the CPU 12.

The DRAM interface 14 is a DRAM controller configured to control the DRAM 6 under control of the CPU 12.

A part of the storage area of the DRAM 6 may be used as the write buffer (WB) 31 for temporarily storing data to be written to the NAND memory 5. Further, the storage area of the DRAM 6 may be used as the GC buffer 32 for temporarily storing data to be copied (moved) during a garbage collection (GC) operation. The storage area of the DRAM 6 may be also used for storing the above-mentioned look-up table 33.

The configuration of the host 2 will now be described.

The host 2 is an information processing apparatus for executing various programs. The programs executed by the information processing apparatus include an application software layer 41, an operating system (OS) 42 and a file system 43.

As is generally known, the operating system 42 is software configured to manage the entire host 2, to control the hardware in the host 2, and to enable applications to use the hardware and the SSD 3.

The file system 43 is used to perform control for operations (creation, saving, updating, erase, etc.) of files. For example, ZFS, Btrfs, XFS, ext4, NTFS, etc., may be used as the file system 43. Alternatively, a file object system (for example, Ceph Object Storage Daemon) or a Key Value Store System (for example, Rocks DB) may be used as the file system 43.

Various application software threads run on the application software layer 41. The application software threads include, for example, client software, database software, etc.

When the application software layer 41 needs to transmit a request, such as a read command or a write command, to the SSD 3, it transmits the request to the OS 42. The OS 42 transmits the request to the file system 43. The file system 43 translates the request into a command (a read command, a write command, etc.). The file system 43 transmits the command to the SSD 3. Upon receiving a response from the SSD 3, the file system 43 transmits the response to the OS 42. The OS 42 transmits the response to the application software layer 41.

FIG. 2 shows a user data area and a system area included in the NAND memory 5.

The storage area of the NAND memory 5 may include a user data area 51 and a system area 52. The user data area 51 is used to store user data that can be written or read by the host 2. The user data area 51 includes a large number of blocks. A certain block (free block) in the user data area 51 is allocated as a write target block to which write data (data to be written) from the host 2 is written. That is, write data received from the host 2 is written to the allocated write target block.

The user data area 51 may include a multi-level-cell (MLC)/triple-level-cell (TLC) area 51A, and a single-level-cell (SLC) area 51B. Each of the large number of blocks in the MLC/TLC area 51A may be realized as an MLC-NAND block wherein two-bit data can be written per memory cell, or as a TLC-NAND block wherein three-bit data can be written per memory cell. Each of some blocks included in the single level cell (SLC) area 51B may be realized as an SLC-NAND block wherein data is written by a write method (SLC write method) for writing one-bit data per memory cell.

The user data may generally be written to a block included in the MLC/TLC area 51A. In this case, one of the free blocks in the MLC/TLC area 51A is allocated as a write target block. The controller 4 writes data stored in the write buffer (WB) 31 to a write target block by a write method for writing multi-bit data (of, for example, two or three bits) per memory cell.

The SLC area 51B may be used to save certain specific data. For example, when a cache flush command is received from the host 2, if the size of the data in the write buffer (WB) 31 is smaller than a predetermined size (for example, the size of one page in an MLC/TLC-NAND block), this data may be written to an SLC-NAND block in the SLC area 51B. In this case, the controller 4 writes the data in the write buffer (WB) 31 to the SLC-NAND block in the SLC area 51B by the write method for writing one-bit data per memory cell.

Figure 3:
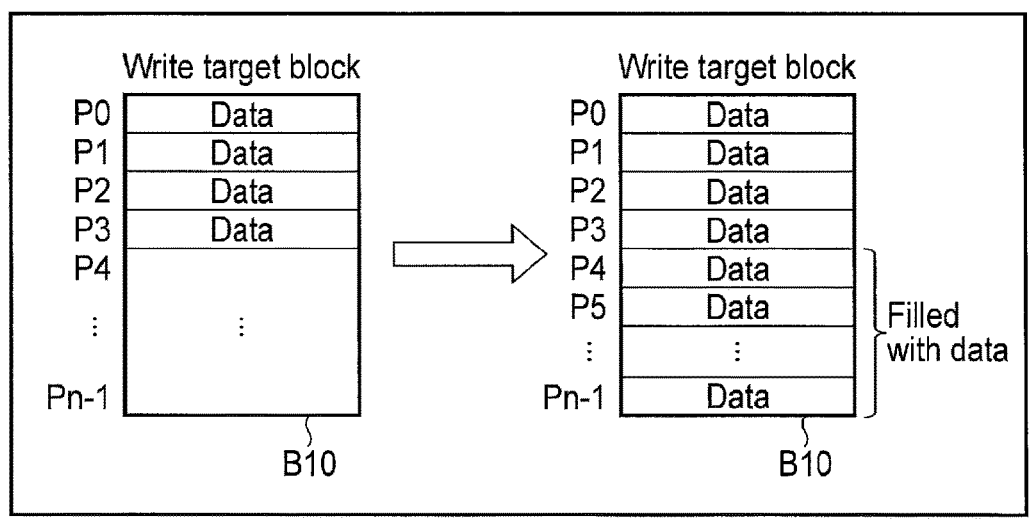
FIG. 3 is a view for illustrating processing, performed by the memory system of the embodiment, for filling up a write destination block with data.

FIG. 3 shows processing of filling up a write target block with data.

In FIG. 3, a state is assumed where data is written on pages P0, P1, P2 and P3 included in pages P0 to Pn−1 of a write target block B10. Pages P4 to Pn−1 are pages of the erased state on which no data is written. When the controller 4 receives, from the host 2, a command (hereinafter, referred tows a command for notifying power down) to instruct the SSD 3 to prepare for power-off, with the write target block B10 partially filled with data as described above, the controller 4 fills up the write target block B10 with data by writing data (valid data) to pages P4 to Pn−1 in the empty area. For instance, the controller 4 may write, to each of pages P4 to Pn−1, data (valid data) currently written to the SLC area 51B. Subsequently, the controller 4 updates the LUT 33 to map the LBAs of the valid data to the physical addresses of pages P4 to Pn−1 in the write target block B10. This can eliminate pages of the erased state from the write target block B10.

FIG. 4 shows the relationship between fill-up processing and a garbage collection operation executed when the gear ratio N is 1.

As described above, if fill-up processing is performed, the write target block B10 does not include pages of the erased state (i.e., available pages). That is, one block (current write target block B10) is consumed by the fill-up processing. In view of this, if the fill-up processing is performed, it is necessary to progress a garbage collection operation to increase one free block while the write target block B10 is being consumed by the fill-up processing.

FIG. 4 shows an assumed case where two blocks B31 and B32 are determined as GC target blocks (second blocks) in which a garbage collection (GC) operation is performed, and the number (N) of copy destination blocks is determined to be 1. The GC target block means a block selected as a target of the GC operation. It is sufficient if the number of GC target blocks and the number (N) of copy destination blocks are determined based on the amount of the valid data of each fragmented block, so as to balance the number of consumed blocks with the number of newly generated free blocks.

The GC target blocks may be managed using a GC target block list 60. As a method of selecting a GC target block, a method of preferentially selecting a block having a greater amount of invalid data from the fragmented blocks may be used.

The controller 4 may perform a garbage collection operation for copying the valid data of blocks B31 and B32 to a copy destination block B21, in parallel with writing data to the write target block B10.

Since the ratio between the number of write target blocks and the number (N) of copy destination blocks is 1:1, the controller 4 may write data corresponding to one unit to the write target block B10, whenever copy of valid data corresponding to one unit to the copy destination block B21 is completed. For example, the controller 4 may write data corresponding to one page to the write target block B10, whenever copy of valid data corresponding to one page to the copy destination block B21 is completed.

Since thus, two GC target blocks B31 and B32 can newly be made as free blocks while two blocks (the write target block B10 and the copy destination block B21) are being consumed by data, a state lacking in free blocks can be avoided.

FIG. 5 shows the relationship between fill-up processing and a garbage collection operation performed when the gear ratio N is 3.

When GC target blocks have relatively large amounts of valid data, the amount of valid data required to be copied in order to increase the number of free blocks increases. Accordingly, the number (N) of copy destination blocks also increases.

FIG. 5 shows an assumed case where four blocks B31, 332, B33 and B34 are determined as GC target blocks, and the number (N) of copy destination blocks is determined to be 3.

The controller 4 may perform a garbage collection operation for copying the valid data of blocks B31, B32, B33 and B34 to three copy destination blocks B21, B22 and B23, in parallel with writing data to the write target block B10.

Since the ratio between the number of write target blocks and the number (N) of copy destination blocks is 1:3, the controller 4 may write data corresponding to one page to the write target block B10, whenever copy of valid data corresponding to three pages is completed.

As a result, while four blocks (the write target block B10, copy destination blocks B21, B22 and B23) are being consumed, four GC target blocks B31, B32, B32 and B33 can be made as free blocks.

As described above, the greater the current gear ratio, i.e., the current number (N) of copy destination blocks, the greater the increase in the amount of valid data required for copying while the write target block B10 is being consumed by the fill-up processing. Therefore, when the write target block B10 is filled up, much more time is required for the fill-up of the write target block B10 as the gear ratio is increased.

Therefore, when, for example, the number of current free blocks of the SSD 3 is smaller than the threshold value, and each fragmented block includes a relatively large amount of valid data, that is, when the number (N) of current copy destination blocks is relatively large, vary much time may be required for the fill-up processing. In this case, long latency may occur in association with a command for notifying power down.

In view of the above, the fill-up control unit 21 of the controller 4 is configured to selectively execute, based on the current gear ratio, namely, the number (N) of current copy destination blocks, processing of filling up the write target block B10, and save processing of making the write target block B10 be a free block instead of filling up the write target block B10.

Figure 6:
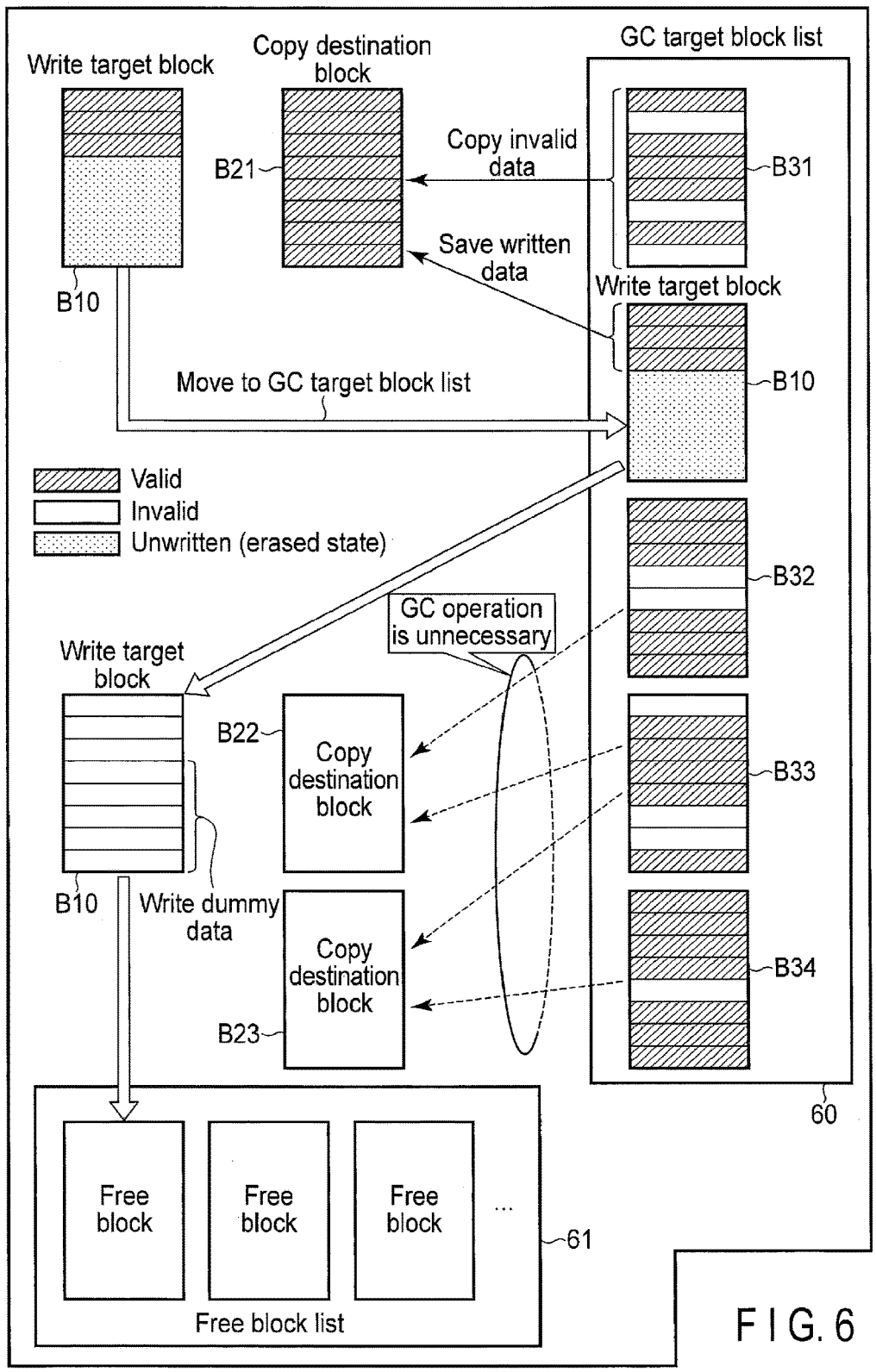
FIG. 6 is a view for illustrating processing, performed by the memory system of the embodiment, for saving write-destination-block data to a copy-destination block.

FIG. 6 shows processing of saving the data of the write target block B10 to a copy destination block.

When the controller 4 has received, from the host 2, a command that notifies power down, with the write target block B10 partially filled with data, the fill-up control unit 21 of the controller 4 determines whether the current gear ratio, namely, the number (N) of current copy destination blocks, is greater than a predetermined threshold value.

If the number (N) of current copy destination blocks is greater than the threshold value, the fill-up control unit 21 of the controller 4 executes save processing as described below, instead of executing the fill-up processing.

In order to make, a free block, the write target block B10 partially filled with data, the fill-up control unit 21 saves, to some of the N copy destination blocks, data already written to the write target block B10. In this case, the fill-up control unit 21 may set the write target block B10 as a GC target block. FIG. 6 shows an example case where the valid data of GC target block B31 has already been copied to copy destination block B21. In this case, the write target block B10 may be set as a GC target block subsequent to GC target block B31. If the size of the empty area of copy destination block B21 is not less than the amount of data written to the write target block B10, for example, if the empty area of copy destination block B21 is of three pages, and the write target block B10 stores data of three pages, all data of the write target block B10 is copied to copy destination block B21. If fill-up of the write target block B10 is not executed, the write target block B10 is not consumed, and hence it is not necessary to perform a garbage collection operation of copying the valid data of GC target blocks B32, B33 and B34 to copy destination blocks B22 and B23.

Moreover, if, for example, the empty area of copy destination block B21 is of four pages, and the write target block B10 stores data of three pages, all data of the write target block B10 and the one-page valid data of GC target block B32 may be copied to copy destination block B21. As a result, pages in the erased state can also be eliminated from copy destination block B21.

In contrast, if the size of the empty area of copy destination block B21 is not greater than the data amount of the write target block B10, for example, if the empty area of copy destination block B21 is of two pages, and the write target block B10 stores data of three pages, the two-page data of the write target block B10 may be copied to copy destination block B21, and the remaining one-page data of the write target block B10 may be copied to subsequent copy destination block B22. In order to fill the entire empty area of copy destination block B22 with data, the valid data of GC target block B32 or dummy data may be written to the empty area of copy destination block B22.

After the data of the write target block B10 is thus saved to one or more copy destination blocks, the fill-up control unit 21 may write dummy data at least to the empty area of the write target block B10. At this time, the entire empty area of the write target block B10 is filled with dummy data, which means that all pages in the erased state are eliminated from the write target block B10. The dummy data means data that is not associated with any LBA. A predetermined write operation may be performed to write data (dummy data) to all pages of the write target block B10, as well as to the empty area of the same. Since the data from the host 2 written to the write target block B10 has already been saved, no problem will occur even if the data of the write target block B10 is destroyed by the predetermined write operation.

The write target block B10 with dummy data written thereto is added to a free block list 61 for managing free blocks.

Figure 7:
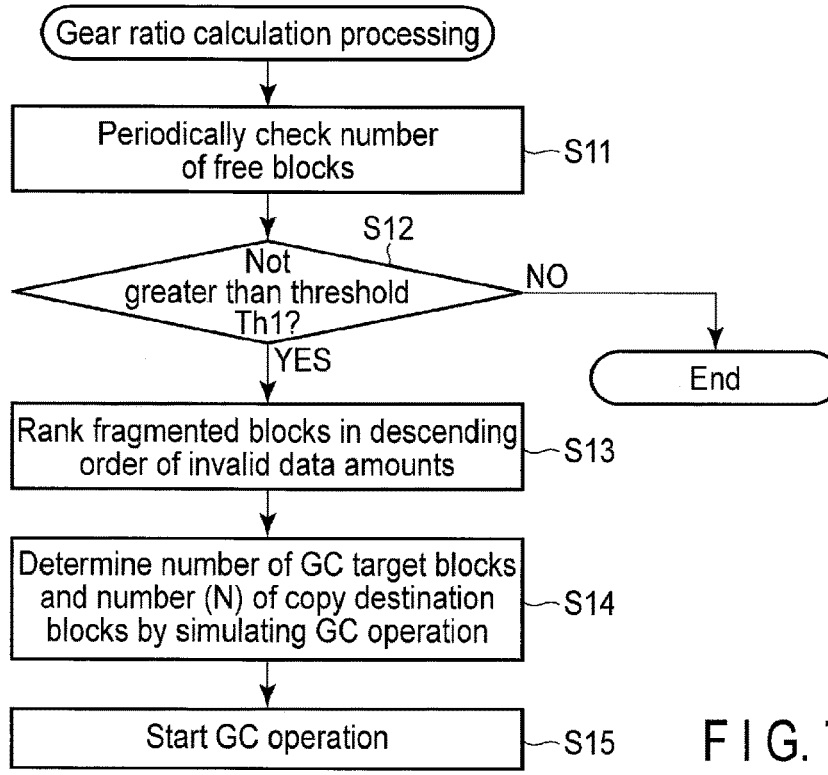
FIG. 7 is a flowchart for illustrating the procedure of gear-ratio calculation processing performed by the memory system of the embodiment.

The flowchart of FIG. 7 shows the procedure of gear ratio calculation processing.

The gear ratio calculation unit 22 of the controller 4 periodically checks the number of free blocks in the NAND memory 5 (step S11), and determines whether the number of free blocks has decreased to threshold Th1 (first threshold value) or less (step S12).

If the number of free blocks has decreased to threshold Th1 or less (YES in step S12), the gear ratio calculation unit 22 ranks fragmented blocks in descending order of the amounts of invalid data (step S13). After that, the gear ratio calculation unit 22 sequentially checks the amounts of valid data stored in respective blocks, beginning with a block of a maximum invalid data amount, thereby calculating the gear ratio, i.e., the number (N) of copy destination blocks required to increase, by one, the number of free blocks by a garbage collection operation while one block is being consumed by data from the host 2.

For example, the gear ratio calculation unit 22 may determine the number of GC target blocks and the number (N) of copy destination blocks by simulating a GC operation of sequentially copying the valid data of blocks to copy destination blocks, beginning with a block of a maximum invalid data amount (step S14).

After that, the gear ratio calculation unit 22 causes the garbage collection operation control unit 23 to start a GC operation (step S15). In step S15, the garbage collection operation control unit 23 allocates N free blocks, computed by the gear ratio calculation unit 22, as copy destination blocks. The garbage collection operation control unit 23 starts the GC operation of copying the valid data of the GC target blocks to the respective N copy destination blocks.

Figure 8:
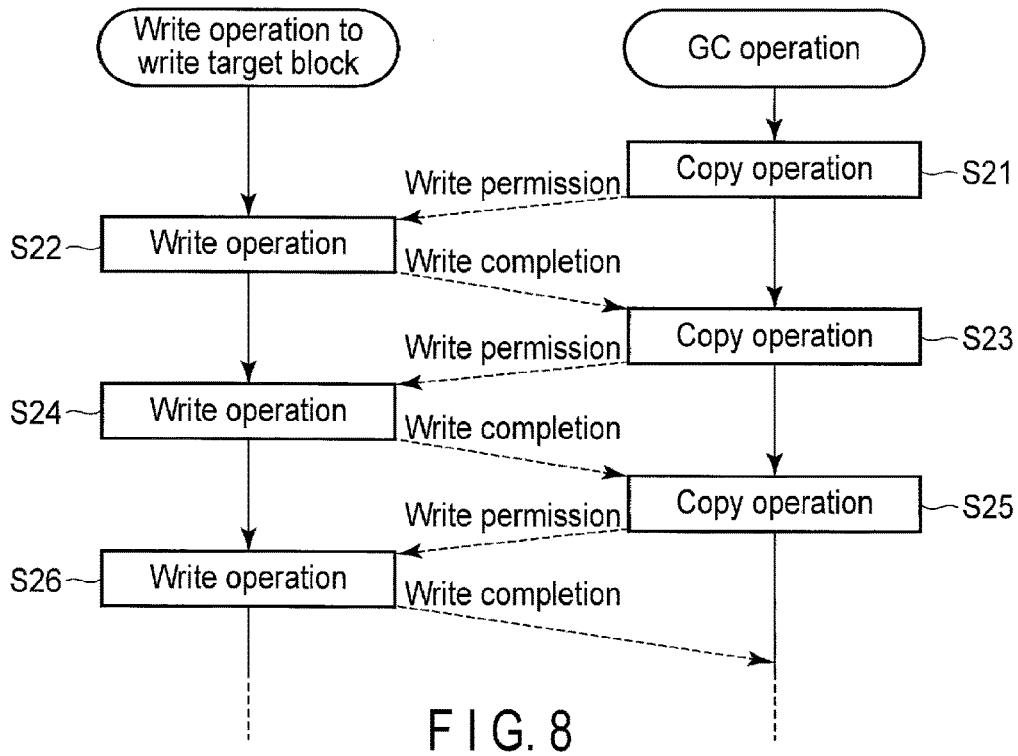
FIG. 8 is a view for illustrating a write operation and a garbage collection operation performed in parallel by the memory system of the embodiment.

FIG. 8 shows a procedure for performing writing of data to a write target block and the GC operation in parallel.

The controller 4 may progress the GC operation so that an operation of copying valid data of a data amount corresponding to N units will be completed while a data amount corresponding to a certain one unit is being written to a write target block. A description will now be given of parallel processing of writing data to a write target block and the GC operation, using, as an example, a case where valid data of N pages is copied while data of one page is being written to the write target block.

When data should be written to a write target block, the controller 4 may copy valid data of N pages before writing the data to the write target block (step S21). In step S21, the controller 4 reads the valid data of N pages from a GC target block, and writes the valid data of N pages to N pages in a copy destination block (step S21). Also in step S21, the controller 4 updates the LUT 33 and maps the LBAs of the valid data to respective physical addresses allocated to the N pages in the copy destination block.

Until the copying of the valid data of N pages is completed, a data write to the write target block is not permitted.

After the copying of the valid data of N pages is completed, the controller 4 writes data of one page to an available page (a page in erased state) of the write target block (step S22). Also in step S22, the controller 4 updates the LUT 33 and maps the LBA of the data to the physical address of the available page of the write target block.

If there is subsequent data to be written to the write target block, the controller 4 copies subsequent valid data of N pages to the copy destination block, updates the LUT 33, and maps the LBAs of this valid data to correct physical addresses (step S23).

If the copying of the valid data of N pages is completed, the controller 4 writes data of subsequent one page to an available page of the write target block, updates the LUT 33, and maps the LBA of this data to the physical address of the available page (step S24).

If there is further subsequent data to be written to the write target block, the controller 4 copies further subsequent valid data of N pages to the copy destination block, updates the LUT 33, and maps the LBAs of this valid data to correct physical addresses (step S25).

If the copying of the valid data of N pages is completed, the controller 4 writes data of further subsequent one page to an available page of the write target block, updates the LUT 33, and maps the LBA of this data to the physical address of the available page (step S26).

The flowchart of FIG. 9 shows the procedure of a garbage collection operation.

The controller 4 first sets, to 1, a variable i indicating a current copy destination block, and copies valid data of N pages to the current copy destination block i (step S31). The controller 4 determines whether the copying of the valid data of N pages is completed (step S32).

If the copying of the valid data of N pages is completed (YES in step S32), the controller 4 permits data of one page to be written to a write target block (step S33). After that, the controller 4 determines whether the write of the data of one page to the write target block is completed (step S34).

If the write of the data of one page to the write target block is completed (YES in step S34), the controller 4 determines whether the current copy destination block i is filled with valid data (it has no empty areas) (step S35).

If the current copy destination block i is filled with valid data (YES in step S35), the controller 4 determines whether the current variable i coincides with the number (N) of copy destination blocks (step S36).

If the current variable i coincides with the number (N) of copy destination blocks (YES in step S36), the controller 4 finishes the garbage collection operation.

In contrast, if the current variable i does not coincide with the number (N) of copy destination blocks (NO in step S36), the controller 4 increments the current variable i by one (step S37), thereby re-executing steps S31 to S36.

The flowchart of FIG. 10 shows the procedure of fill-up/save processing performed upon receiving a command for notifying power down.

Upon receiving a command for notifying power down, the controller 4 determines whether the current gear ratio, i.e., the number (N) of copy destination blocks, is greater than predetermined threshold Th2 (second threshold value), in order to estimate the time required for fill-up processing (step S41).

If the number (N) of copy destination blocks is not greater than threshold Th2 (NO in step S41), the controller 4 determines that the time required for fill-up processing is sufficiently short, and executes the above-mentioned fill-up processing of writing data up to the last page of the write target block (step S43). In step S43, the controller 4 may perform the current GC operation and the above-mentioned fill-up processing in parallel. It is a matter of course that the GC operation is not performed if the number (N) of copy destination blocks is zero.

In step S43, the controller 4 may also perform the following processing.

If unwritten data that has not yet been written to the NAND memory 5 exists in the write buffer (WB) 31, the controller 4 first writes, to the write target block, the unwritten data in the write buffer (WB) 31. If the amount of the unwritten data is less than the size of the empty area of the write target block, the controller 4 further writes, to the empty area of the write target block, data (such as data stored in an SLC-NAND block in the SLC area 51B) already written to the NAND memory 5, thereby filling up the write target block with data. If unwritten data does not exist in the write buffer (WB) 31, the controller 4 writes only the data already written to the NAND memory 5 to the empty area of the write target block, thereby filling up the write target block with data.

In contrast, if the number (N) of copy destination blocks is greater than threshold Th2 (YES in step S41), the controller 4 may determine whether the number of unwritten pages in the write target block is less than predetermined threshold Th3 (third threshold value). This is because in a case where a data write to the write target block and the GC operation are performed in parallel, even when the number (N) of copy destination blocks is greater than threshold Th2, if the number of unwritten pages in the write target block is relatively small, the time required for the fill-up processing is relatively short. The number of unwritten pages in the write target block indicates the number of erased pages (pages of an erased state) included in the current empty area of the write target block.

If the number of unwritten pages in the write target block is less than threshold Th3 (YES in step S42), the controller 4 determines that the time required for the fill-up processing is sufficiently short, and executes the fill-up processing of the write target block (step S43).

If the number (N) of copy destination blocks is greater than threshold Th2 (YES in step S41), and if the number of unwritten pages in the write target block is not less than threshold Th3 (NO in step S42), the controller 4 determines that a lot of time is required for the fill-up processing. At this time, the controller 4 performs a following save processing of making the write target block be a free block, instead of the fill-up processing of the write target block.

That is, the controller 4 saves, to a copy destination block, data already written to the write target block, by setting the write target block as the GC target block (step S44). In step S44, (1) if data (unwritten data) which has not yet been written to the NAND memory 5 exists in the write buffer (WB) 31, the controller 4 may first write data (unwritten data) in the write buffer (WB) 31 to the write target block. (2) After that, the controller 4 may save, to the copy destination block, data already written to the write target block, and the data (unwritten data) of the write buffer (WB) 31 written to the write target block in the above step (1). Since the data in the write target block is eventually saved to the copy destination block, the controller 4 may save the data (unwritten data) in the write buffer (WB) 31 to the copy destination block, without writing the data (unwritten data) to the write target block.

After that, the controller 4 writes dummy data to at least the empty area of the write target block (step S45), and puts the write target block to the free block list 61 (step S46).

The controller 4 executes steps S44 to S46 (save processing), with the current GC operation (scheduled to be executed in parallel with a data write to the write target block) stopped. That is, the controller 4 stops the above-mentioned current GC operation, and executes steps S44 to S46 (save processing). This is because the write target block is converted into a free block by the processing of steps S44 to S46.

The flowchart of FIG. 11 shows another procedure of fill-up/save processing.

In this procedure, steps S51 and S52 are executed instead of steps S41 and S42 of FIG. 10.

In step S51, the controller 4 calculates (estimates) a period T required for filling up the write target block, based on the number (N) of copy destination blocks, or on both the number (N) of copy destination blocks and the number of unwritten pages in the write target block. Subsequently, the controller 4 determines whether the period T is longer than predetermined threshold Th4 (step S52).

If the period T is short enough, i.e., if the period T is not longer than predetermined threshold Th4 (NO in step S52), the controller 4 performs the above-mentioned fill-up processing of writing data up to the last page of the write target block (step S43). This fill-up processing is performed in parallel with the current GC operation.

If the period T is longer than predetermined threshold Th4 (YES in step S52), i.e., if a long time is required for the fill-up processing, the controller 4 executes steps S44 to S46 of FIG. 10 instead of the fill-up processing, with the current GC operation stopped.

Figure 12:
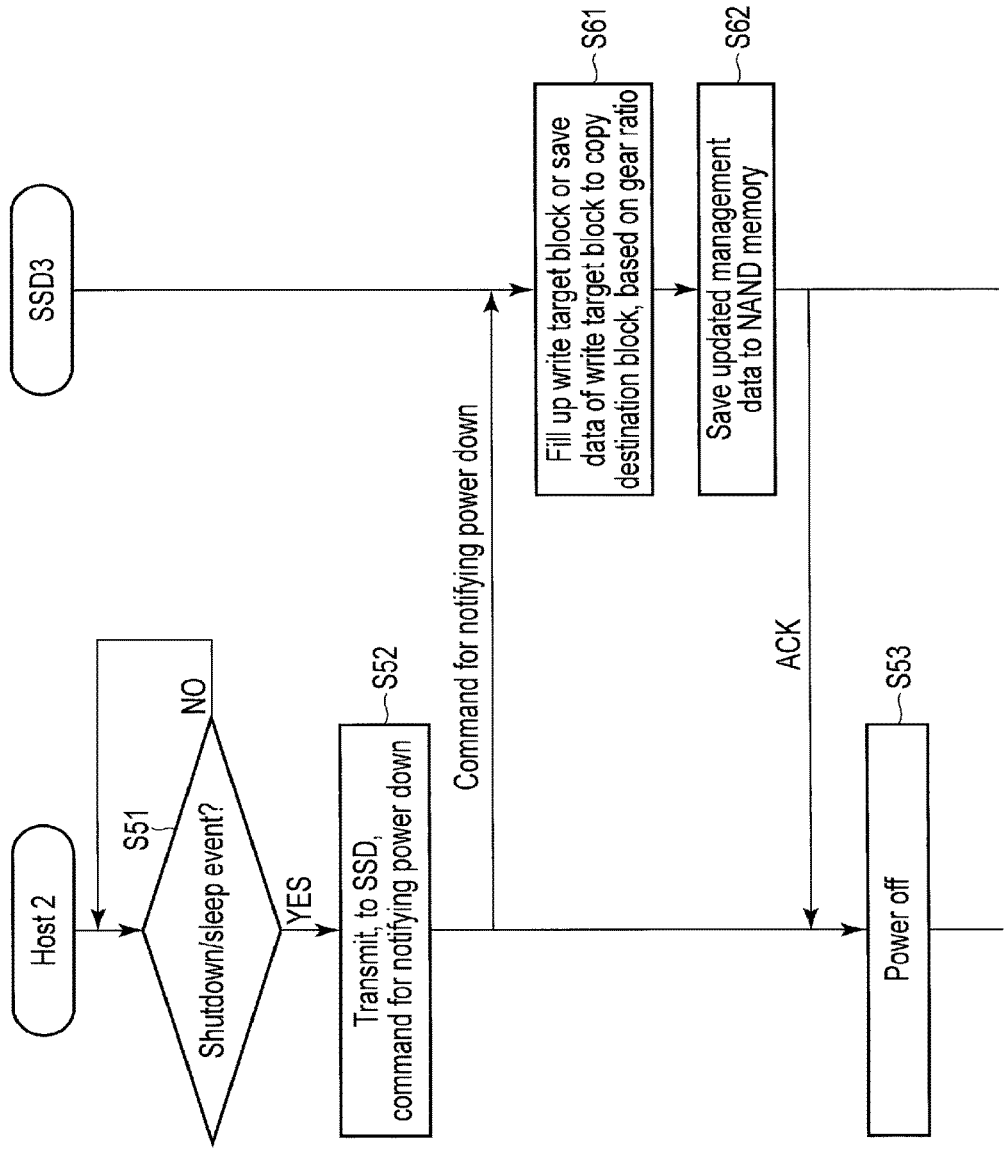
FIG. 12 is a view for illustrating a sequence of shutdown processing performed by the host and the memory system of the embodiment.

FIG. 12 shows a sequence of shutdown processing performed by the host 2 and the SSD 3.

If an event of shutdown or sleep (for example, hibernation) has occurred in the host 2 (YES in step S51), the host 2 transmits to the SSD 3 a command for notifying power down (step S52).

In response to the command for notifying power down, the controller 4 of the SSD 3 performs processing for preparing the power down of the SSD 3. First, the SSD 3 fills up the write target block with data, or saves the data of the write target block to a copy destination block in order to make the write target block be a free block, based on the number (N) of copy destination blocks, or on both the number (N) of copy destination blocks and the number of unwritten pages in the write target block (step S61). After that, the controller 4 saves updated management data, such as the content of the LUT 33, to the NAND memory 5 (step S62). If the processing for preparing for the power down of the SSD 3 is completed, the SSD 3 transmits, to the host 2, an acknowledgment (ACK) response to the command for notifying power down, thereby notifying the host 2 that preparation for the power down has been completed.

In response to the acknowledgment (ACK) from the SSD 3, the host 2 switches to a shutdown state or a sleep state where the power of the host 2 and that of the SSD 3 are turned off (step S53).

Also when receiving a cache flush command from the host 2, the controller 4 may execute steps S61 and S62 and processing of transmitting, to the host 2, an acknowledgment (ACK) response (indicating the completion of the command) to the cache flush command. However, management data saved to the NAND memory 5 when receiving the cache flush command may differ from management data saved to the NAND memory 5 when receiving the command for notifying power down.

Next, a description will be given of processing of saving data of the write target block to a block different from the copy destination block.

FIG. 13 shows processing of saving the data of the write target block to a dedicated block allocated for data saving.

When the controller 4 receives, from the host 2, a command for notifying power down, with the write target block B10 partially filled with data, the fill-up control unit 21 of the controller 4 determines whether the current gear ratio, i.e., the number (N) of current copy destination blocks, is greater than a certain predetermined threshold value.

If the number (N) of current copy destination blocks is greater than the threshold value, the fill-up control unit 21 of the controller 4 performs save processing, described below, instead of the fill-up processing.

In order to make a free block, the write target block B10 partially filled with data, the fill-up control unit 21 saves data already written to the write target block B10 to, for example, an SLC-NAND block B71 in the SLC area 51B, which is a dedicated block allocated for data saving. In this case, the fill-up control unit 21 reads data from the write target block B10, and writes this data to the SLC-NAND block B71 by the SLC write method wherein one-bit data is written per memory cell. This is because the reliability of the SLC-NAND block B71 is high, and data can be written (programmed) after part of the area in the SLC-NAND block B71 is left in an erased state.

After the data of the write target block B10 has been saved to the SLC-NAND block B71, the fill-up control unit 21 may write dummy data to at least an empty area in the write target block B10. Since thus, the entire empty area of the write target block B10 is filled with dummy data, pages in the erased state are eliminated from the write target block B10. All pages, as well as the empty area, of the write target block B10 may be subjected to the above-described predetermined write operation for writing data (dummy data) to all pages of the write target block B10. Since the data of the host 2, written to the write target block B10, is already saved, no problem will occur even if the data of the write target block B10 is destroyed by the predetermined write operation.

The write target block B10, to which dummy data has been written, is added to the free block list 61 for managing free blocks.

The flowchart of FIG. 14 shows another procedure of the fill-up/save processing. In this procedure, the data of the write target block B10 is saved to a block dedicated to data saving, instead of the copy destination block for the GC operation.

When receiving the command for notifying power down from the host 2, the controller 4 determines whether the current gear ratio, i.e., the number (N) of current copy destination blocks, is greater than predetermined threshold Th2 (step S71).

If the number (N) of current copy destination blocks is not greater than threshold Th2 (NO in step S71), the controller 4 performs the above-described fill-up processing of writing data up to the last page of the write target block (step S73). This fill-up processing is performed in parallel with the current GC operation. The fill-up processing is performed in the same procedure as the processing of step S43 described referring to FIG. 11.

In contrast, if the number (N) of copy destination blocks is greater than threshold Th2 (YES in step S71), the controller 4 may determine whether the number of unwritten pages of the write target block is less than predetermined threshold Th3. This is because, as described above, in a case where a data write to the write target block and the GC operation are performed in parallel, even when the number (N) of copy destination blocks is greater than threshold Th2, if the number of unwritten pages in the write target block is relatively small, the time required for the fill-up processing is relatively short.

If the number of unwritten pages of the write target block is less than threshold Th3 (YES in step S72), the controller 4 performs the fill-up processing of the write target block (step S73).

In contrast, if the number (N) of copy destination blocks is greater than threshold Th2 (YES in step S71), and if the number of unwritten pages of the write target block is not less than threshold Th3 (NO in step S72), the controller 4 performs, instead of the fill-up processing of the write target block, save processing for making the write target block be a free block, with the current GC operation stopped.

That is, the controller 4 saves the data already written to the write target block to a dedicated block (for example, an SLC-NAND block) (step S74). In step S74, (1) if data (unwritten data) not yet written to the NAND memory 5 exists in the write buffer (WB) 31, the controller 4 may first write, to the write target block, the data (unwritten data) in the write buffer (WB) 31. Further, (2) the controller 4 may save, to a dedicated block (for example, an SLC-NAND block), the data already written to the write target block and the data (unwritten data) of the write buffer (WE) 31 written to the write target block in the above step (1). Since the data of the write target block is eventually saved to a dedicated block (for example, an SLC-NAND block), the controller 4 may directly save the data (unwritten data) of the write buffer (WB) 31 to a dedicated block (for example, an SLC-NAND block), without writing the same to the write target block.

After that, the controller 4 writes dummy data at least to an empty area in the write target block (step S75), and puts the write target block in the free block list 61 (step S76).

The flowchart of FIG. 15 shows yet another procedure of the fill-up/save processing.

In this procedure, steps S81 and S82 are executed instead of steps S71 and S72 of FIG. 14.

In step S81, the controller 4 calculates (estimates) the period T required for the fill-up of a write target block, based on number (N) of copy destination blocks, or based on both the number (N) of copy destination blocks and the number of unwritten pages in a write target block. After that, the controller 4 determines whether the period T is longer than predetermined threshold Th4 (step S82).

If the period T is not longer than predetermined threshold Th4 (NO in step S82), the controller 4 performs the above-described fill-up processing of writing data up to the last page of the write target block (step S73). This fill-up processing is performed in parallel with a current GC operation.

In contrast, if the period T is longer than predetermined threshold Th4 (YES in step S82), the controller 4 executes, instead of the fill-up processing, steps S74 to S76 described above referring to FIG. 14, with the current GC operation stopped.

FIG. 16 shows a hardware configuration example of the information processing apparatus that functions as the host 2.

This information processing apparatus is realized as a server computer or a personal computer. The information processing apparatus comprises a processor (CPU) 101, a main memory 102, a BIOS-ROM 103, a network controller 105, a peripheral interface controller 106, a controller 107, an embedded controller (EC) 108, a power supply circuit 109, etc.

The processor 101 is a CPU configured to control the operation of each component of the information processing apparatus. The processor 101 executes various programs loaded from any one of a plurality of SSDs 3 to the main memory 102. The main memory 102 comprises a random access memory, such as a DRAM. The programs executed by the processor 101 include the above-mentioned application software layer 41, OS 42 and file system 43.

Moreover, the processor 101 also executes a basic input/output system (BIOS) stored in the BIOS-ROM 103 that is a nonvolatile memory. The BIOS is a system program for hardware control.

The network controller 105 is a communication device, such as a wired LAN controller or a wireless LAN controller. The peripheral interface controller 106 is configured to communicate with a peripheral device, such as a USB device.

The controller 107 is configured to communicate with devices connected to a plurality of connectors 107A. In the embodiment, the SSDs 3 are connected to the respective connectors 107A.

The controller 107 may be an SAS expander, a PCIe switch, a PCIe expander, a flash array controller, or a RAID controller.

The EC 108 functions as a system controller configured to execute power management of the information processing apparatus. The EC 108 cooperates with the power supply circuit 109 to turn on and off the information processing apparatus in accordance with a user operation of a power switch. The EC 108 is realized as a processing circuit, such as a single-chip microcontroller. The EC 108 may contain a keyboard controller for controlling input devices, such as a keyboard (KB). The power supply circuit 109 generates operation power to be supplied to the components of the information processing apparatus and to each SSD 3, using electric power supplied from an AC/DC adaptor 110.

Figure 17:
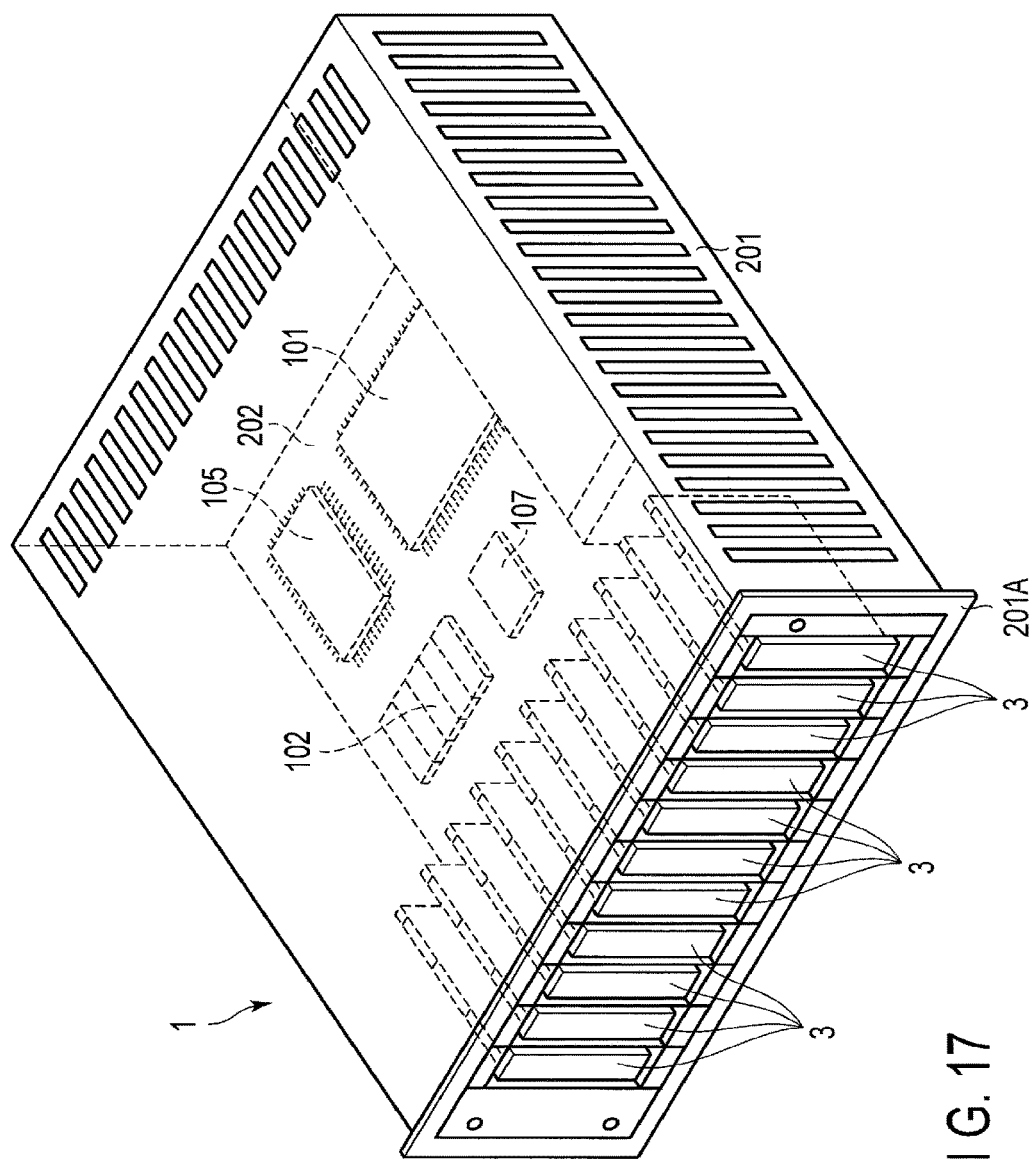
FIG. 17 is a perspective view showing a configuration example of a computer including the memory system of the embodiment and the host.

FIG. 17 shows a structure example of the information processing apparatus that comprises the plurality of SSDs 3 and the host 2.

The information processing apparatus comprises a thin box-shaped casing 201 that can be accommodated in a rack. A large number of SSDs 3 may be arranged in the casing 201. In this case, each SSD 3 may be detachably inserted in a slot formed in the front surface 201A of the casing 201.

A system board (motherboard) 202 is provided in the casing 201. On the system board (motherboard) 202, various electronic component parts including the CPU 101, the memory 102, the network controller 105, and the controller 107 are mounted. These electronic component parts cooperate to function as the host 2.

As described above, in the embodiment, the fill-up processing of filling up the write target block B10, and the save processing of making the write target block B10 be a free block instead of filling up the write target block B10, are selectively performed in accordance with a current gear ratio, i.e., the number (N) of current copy destinations block. Therefore, the time required for processing of preparing for power-off can be reduced, thereby suppressing increases in latency even if the number of free blocks in the SSD 3 has decreased.

In addition, in the embodiment, the nonvolatile memory is formed of a NAND memory. However, the function of the embodiment is also applicable to other various nonvolatile memories, such as a three-dimensional NAND memory, a magnetoresistive random access memory (MRAM), a phase-change random access memory (PRAM), a resistive random access memory (ReRAM), and a ferroelectric random access memory (FeRAM).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
 a nonvolatile memory including a plurality of blocks;
 a volatile memory including a write buffer configured to temporarily store data designated by a write command received from a host; and
 a controller electrically connected to the nonvolatile memory, and configured to:
  write the data stored in the write buffer to a first block, the first block being included in the plurality of blocks;
  execute a garbage collection when the number of free blocks in the nonvolatile memory is not greater than a first threshold value;
  calculate a first number based on amounts of invalid data in a plurality of second blocks, the first number being a ratio of the number of copy destination blocks needed for the garbage collection to the number of blocks to which the data designated by the write command is written, the plurality of second blocks being included in the plurality of blocks;
  determine whether the first number is greater than a second threshold value when an empty area exists in the first block and the controller receives a first command from the host, the first command being either a command for instructing preparation of power-off, or a command for requesting flushing the data stored in the write buffer to the nonvolatile memory;
  perform fill-up processing for the first block by writing, to the empty area in the first block, at least one of unwritten data in the write buffer and data written to the nonvolatile memory, when the first number is not greater than the second threshold value; and
  save the data written to the first block to a third block and write dummy data to the empty area of the first block, when the first number is greater than the second threshold value, the third block being included in the plurality of blocks.

2. The memory system of claim 1, wherein the controller is configured to:
 perform the fill-up processing in parallel with the garbage collection when performing the fill-up processing for the first block; and
 stop the garbage collection, save the data written to the first block, and write the dummy data, when the first number is greater than the second threshold value.

3. The memory system of claim 1, wherein
 the empty area includes one or more erased pages; and
 the controller is configured to:
  determine whether the number of the one or more erased pages is less than a third threshold value;
  perform the fill-up processing for the first block when the first number is not greater than the first threshold value, or when the first number is greater than the first threshold value and the number of the one or more erased pages is less than the third threshold value; and
  save the data written to the first block and write the dummy data, when the first number is greater than the first threshold value and the number of the one or more erased pages is not less than the third threshold value.

4. The memory system of claim 1, wherein the controller is configured to:
 rank the second blocks in descending order of the amounts of invalid data when the number of free blocks in the nonvolatile memory is not greater than the first threshold value; and calculate the first number by sequentially checking amounts of valid data, beginning with a block having the highest amount of invalid data.

5. The memory system of claim 1, wherein the controller is configured to:
   save, to the nonvolatile memory, management data stored in the volatile memory, after performing the fill-up processing for the first block, or saving the data written to the first block and writing the dummy data; and
   transmit, to the host, an acknowledgment to the first command after saving the management data.

6. The memory system of claim 1, wherein when the first number is greater than the second threshold value, the controller writes unwritten data in the write buffer to the first block, and saves, to the third block, the data written to the first block and the unwritten data written to the first block.

7. The memory system of claim 1, wherein the third block is a copy destination block associated with the garbage collection.

8. The memory system of claim 1, wherein the third block is a dedicated block allocated for data saving.

9. The memory system of claim 8, wherein the third block is a single level cell (SLC) block.

10. The memory system of claim 1, wherein the volatile memory is a dynamic random access memory (DRAM).

11. A method for controlling a memory system comprising a volatile memory and a nonvolatile memory including a plurality of blocks, the method comprising:
   temporarily storing, in a write buffer in the volatile memory, data designated by a write command received from a host;
   writing the data stored in the write buffer to a first block, the first block being included in the plurality of blocks;
   executing a garbage collection when the number of free blocks in the nonvolatile memory is not greater than a first threshold value;
   calculating a first number based on amounts of invalid data in a plurality of second blocks, the first number being a ratio of the number of copy destination blocks needed for the garbage collection to the number of blocks to which the data designated by the write command is written, the plurality of second blocks being included in the plurality of blocks;
   determining whether the first number is greater than a second threshold value, when an empty area exists in the first block and a first command is received from the host, the first command being either a command for instructing preparation of power-off, or a command for requesting flushing the data stored in the write buffer to the nonvolatile memory;
   performing fill-up processing for the first block by writing, to the empty area in the first block, at least one of unwritten data in the write buffer and data written to the nonvolatile memory, when the first number is not greater than the second threshold value; and
   saving the data written to the first block to a third block and writing dummy data to the empty area of the first block, when the first number is greater than the second threshold value, the third block being included in the plurality of blocks.

12. The method of claim 11, wherein
   the fill-up processing is performed in parallel with the garbage collection when the fill-up processing is performed for the first block; and
   the garbage collection is stopped, the data written to the first block is saved, and the dummy data is written, when the first number is greater than the second threshold value.

13. The method of claim 11, wherein
   the empty area includes one or more erased pages;
   the method further comprises determining whether the number of the one or more erased pages is less than a third threshold value;
   when the first number is not greater than the first threshold value, or when the first number is greater than the first threshold value and the number of the one or more erased pages is less than the third threshold value, the fill-up processing is performed for the first block; and
   when the first number is greater than the first threshold value and the number of the one or more erased pages is not less than the third threshold value, the data written to the first block is saved and the dummy data is written.

14. The method of claim 11, wherein the calculating the first number includes:
   ranking the second blocks in descending order of the amounts of invalid data when the number of free blocks in the nonvolatile memory is not greater than the first threshold value; and
   calculating the first number by sequentially checking amounts of valid data, beginning with a block having the highest amount of invalid data.

15. The method of claim 11, further comprising:
   saving, to the nonvolatile memory, management data stored in the volatile memory, after performing the fill-up processing for the first block, or saving the data written to the first block and writing the dummy data; and
   transmitting, to the host, an acknowledgment to the first command after saving the management data.

16. The method of claim 11, further comprising:
   writing, to the first block, unwritten data in the write buffer when the first number is greater than the second threshold value; and
   saving, to the third block, the data written to the first block and the unwritten data written to the first block.

17. The method of claim 11, wherein the third block is a copy destination block associated with the garbage collection.

18. The method of claim 11, wherein the third block is a dedicated block allocated for data saving.

19. The method of claim 17, wherein the third block is a single level cell (SLC) block.

20. The method of claim 11, wherein the volatile memory is a dynamic random access memory (DRAM).

* * * * *